United States Patent [19]

Chen et al.

[11] 4,078,260

[45] Mar. 7, 1978

[54] APPARATUS FOR TRANSPOSITION SORTING OF EQUAL LENGTH RECORDS IN OVERLAP RELATION WITH RECORD LOADING AND EXTRACTION

[75] Inventors: Tien Chi Chen; Kapali P. Eswaran, both of San Jose; Vincent Yu-Sun Lum, Monte Sereno; Chin Tung, Saratoga, all of Calif.

[73] Assignee: International Business Machines Corporation, Armonk, N.Y.

[21] Appl. No.: 685,859

[22] Filed: May 12, 1976

[51] Int. Cl.² .................... G06F 7/36; G06F 13/00; G11C 11/02
[52] U.S. Cl. ........................................ 364/900; 365/1
[58] Field of Search ...... 340/172 S, 174 TF, 174 AA, 340/146.2; 364/900, 200

[56] References Cited

U.S. PATENT DOCUMENTS 3,950,732  4/1976  Chang ........................... 340/174 TF

*Primary Examiner*—James D. Thomas
*Attorney, Agent, or Firm*—R. Bruce Brodie

[57] ABSTRACT

An apparatus for sorting of equal length records with the sorting time maximally overlapped by the time taken for loading and unloading of records. The minimal structure consists of a decision mechanism linked to and associated with a network of ladder structures. The activity within the network is so synchronized that the sorting activity in most ladders occurs while some ladder within the network is still undergoing the loading of input data; and during the unloading phase, the individually sorted data from each ladder are merged concurrently to produce a sequence of sorted records. The overlap between sorting and loading varies from 0 for records requiring no loading/unloading, to 100% for multi-ladder networks with loading/unloading.

A single ladder structure supporting a type of transposition sort is first described both in a full exchange scheme and a fast version. Then, the mechanism for loading/unloading equal length records to the single ladder is set forth. Next, the use of two ladders of dissimilar lengths for facilitating the overlap between loading/unloading and sorting is revealed. Lastly, the general multi-ladder case with which complete overlap is achieved terminates the specification.

The ladders themselves are formed from a plurality of equal length loops connected by dual mode switches such that when a switch between a pair of adjacent loops is set electrically into the first mode ("on") the adjacent loops are cross-connected facilitating an exchange of any records circulating therein. When the two switches bounding a loop are electrically set in the second mode ("off"), the loop is maintained as a circulating path. An end loop of each ladder operates as an input/output port.

In one embodiment, control signals for operating the dual-mode switches are developed by an external decision mechanism through the expedient of storing and comparing the keys of each record to be sorted, said signals control the switches in loading, sorting, merging and extracting. An alternate embodiment can employ a plurality of detectors to transmit the detected keys to a decision mechanism dynamically without previously copying the keys.

5 Claims, 12 Drawing Figures

ONE IMPLEMENTATION OF THE BINARY SWITCH IN MAGNETIC BUBBLE TECHNOLOGY

FIG.1B

FIG. 2B FORMAT OF RECORD R (K: COMPARE FOR EXCHANGE)

FIG. 4A EXAMPLE OF SINGLE LADDER ODD-EVEN TRANSPOSITION SORT

FIG. 3  PHYSICAL IMPLEMENTATION OF BUBBLE LADDER SORTER

FIG. 4B  EXAMPLE OF THE QUICK SINGLE LADDER ODD-EVEN TRANSPOSITION SORT

FIG. 5A  SWITCH SETTING

FIG. 5B  LOADING OF RECORDS

FIG. 6A SINGLE LADDER SORTER

FIG. 6B TWO-LADDER SORTER

FIG. 6C A THREE LADDER SORTER

APPARATUS FOR TRANSPOSITION SORTING OF EQUAL LENGTH RECORDS IN OVERLAP RELATION WITH RECORD LOADING AND EXTRACTION

BACKGROUND OF THE INVENTION

This invention relates to the use of arrays of linkable circulating storage loops and, more particularly, to the use of said arrays for sorting of records so as to produce an arrangement of records whose corresponding keys obey a specified linear ordering.

The importance of sorting in data processing is a matter of common knowledge. Typically, one deals with a set of records $\{R_i\}, i = 0, 1, 2, \ldots (N-1)$ and corresponding keys $\{K_i\}$. The records need to be arranged in a linear sequence in the order of the keys. Whenever two keys are rated as equal, some tie-breaking procedure is invoked. The keys can be embedded entirely within the records, to be sampled dynamically whenever comparison is needed. Alternatively, the keys may lie outside the records in some form more accessible to the control mechanism with a one-to-one correspondence to the records. Often the keys are embedded in the records, but duplicate copies of the keys are used for the ordering.

Reference is made to H. Chang et al, U.S. patent application Ser. No. 556,378, filed Mar. 7, 1975, entitled "Ladder for Information Processing". This reference describes information processing achieved by a structure using a dual mode switch. The switch can steer two data streams so that they will either cross one another or bypass one another, depending upon external control. A linear array of shift register loops can be linked together by means of these flow steering binary switches to form a storage structure termed a ladder. A similar ladder structure results from the use of an alternative switch having two orthogonal bypass modes.

The ladder provides a variety of information handling modes. For example, the ladder can dynamically rearrange records according to recency of usage in order to improve average access time to any record. The binary switch and the ladder structure are implementable using magnetic bubble domain technology.

In Chang et al, the ladder is described in detail. Since each loop has no more than two adjacent, switchably interconnecting neighbor loops, then upon any boundary switch being set into a first mode or "on", the two adjacent loops linked by said switch are cross-connected thereby enabling an exchange of any records circulating therein. When the two boundary switches to any given loop are set into a second mode or "off", then the loop is maintained as a circulating path.

Reference is also made to T. C. Chen et. al. U.S. Pat. No. 3,997,880 issued on Dec. 14, 1976 based on an application filed on Mar. 7, 1975, entitled "Apparatus and Machine Implementable Method for the Dynamic Rearrangement of Plural Bit Equal Length Records". In this second reference, there is described an apparatus for performing efficient permutations of equal length records. This apparatus, as in the first reference, also takes advantage of the flow steering property of linkable storage loops. It is directed to the dynamic ordering of fixed length records among loops that are linearly linked with aforesaid flow steering switches. Another description may be found in T. C. Chen and C. Tung, "Storage Management Operations in Linked Uniform Shift Register Loops", IBM Journal of Research and Development, March 1976, pages 123-131.

Both references, while using switchable linearly linked loops, are nevertheless distinquished from each other. In the first reference, all but one of the loops are double-sized, each holding two records except for the top loop which holds a single record. Further, in the first reference, all the switches linking the double size loops are set in the same mode. In the second reference, all loops are of equal length with each one holding but one record, and all switches are freely set. The freedom of switching can then be exploited, for example, to migrate a record dynamically over D loop levels, taking $(D+1)/2$ periods, a period being the time required for one data bit to make one revolution around a loop with the boundary switches off.

SUMMARY OF THE INVENTION

It is an object of this invention to devise an apparatus for sorting equal length records, the sorting time being in overlap with the loading and the unloading of the records. It is a related object to devise a sorting apparatus operating in the first instance as the performance equivalent for sorting a sequence of N equal length records on a single N-loop ladder wherein it takes N periods to enter N records into the N-loop ladder, $(N+1)/2$ periods for performing the sorting using the exchange operations as described by the second reference, and N periods to extract the N sorted records from the N loop ladder. In the second instance, it is the object to overlap the sorting with the load/unload such that the total operation will take only 2N periods.

The foregoing objectives are satisfied by an externally controllable apparatus for sorting N equal fixed length plural bit records, each record having a key. The apparatus comprises $q$ sorting ladders, each of whose sorting time is a linear function of the number of records to be sorted. The ith ladder has its capacity $c_i$ constrained to accept $n_i$ records such that $q \geq \lceil 1 + \log_3((N+1)/4) \rceil$, $$\sum_{i=1}^{q} n_i = N,$$

$n_i = Q_{i-1} - Q_i$, $Q_0 = N$, and $Q_i \geq \lfloor Q_{i-1}/3 \rfloor$. In this regard, $Q_i$ is the number of remaining records after assigning $n_i$ records to the ith ladder. Whenever $Q_i \leq 3$, then $n_{i+1}$ can be assigned the value $Q_i$. The apparatus further comprises means for serially loading and unloading N records into and from the aggregate of $q$ ladders. Parenthetically, $\lfloor X \rfloor$ denotes the greatest integer $\leq X$ and $\lceil X \rceil$ denotes the least integer $\geq X$.

The method of the invention includes the steps of loading the above constrained plural ladder apparatus such that the $(i+1)st$ ladder is loaded immediately after the ith ladder; and sorting the contents of the ith ladder in time overlap relation with the loading of the $(i+1)st$ and other ladders. Note, it is an aspect of the invention that the serial loading and unloading of N records into and from the aggregate of $q$ ladders occurs in no more than 2N consecutive equal time units.

The invention is also embodied in an apparatus capable of sorting N equal length records. This embodiment combines together with the above described externally controllable apparatus such elements as a data bus supporting the transmission of the records; memory means; means responsive to each record to be sorted as transmitted on the data bus for copying the key field thereof into the memory means; and means for developing groups of control signals, which signals actuate selected dual mode switches of the ladders.

BRIEF DESCRIPTION OF THE DRAWING

FIG. 4A shows a single ladder transposition sort while

DESCRIPTION OF THE PREFERRED EMBODIMENTS

Figure 1A:
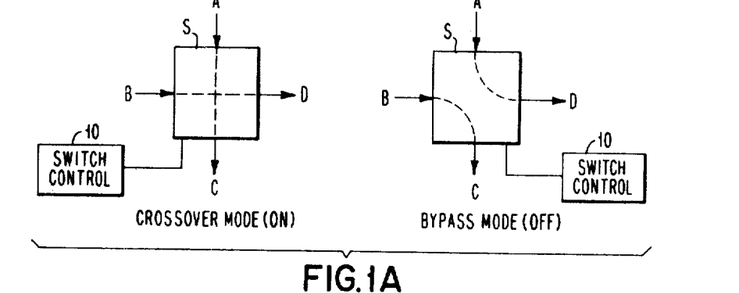
FIG. 1A shows the dual mode binary switch in loop crossover and loop bypass operations.

Referring now to FIG. 1A, there is shown a dual mode switch capable of directing two guided streams of magnetic bubbles in two distinct modes. In the first, or crossover mode, a bubble information stream is applied along path A at the switch input. The stream leaves at path C at the output. Likewise, a bubble information stream present at input B, leaves at output D. In contrast, in the second or bypass mode, bubble information stream inputs at A and B of switch S respectively leave at outputs D and C.

In the following explanation, it will be assumed that the switch and later described structures utilizing the switches are fabricated from magnetic bubble devices and that the data streams within those devices are bubble domain information streams. However, as will be pointed out later, other technologies, such as semi-conductor charge-coupled devices, can also be used to implement the structures.

It is recognized that data streams are usually propagated as sequences of electrical signals. This requires some transformation between the electric signals and the magnetic signals so as to on one hand generate a bubble stream equivalent of an electric signal sequence and the counterpart transformation of generating an electric signal sequence from a bubble domain stream. Such conversion devices are well known as, for example, Y. S. Lin, et al., U.S. Pat. No. 3,780,312, "Threshold Logic Using Magnetic Bubble Domains", issued Dec. 18, 1973.

Figure 1B:
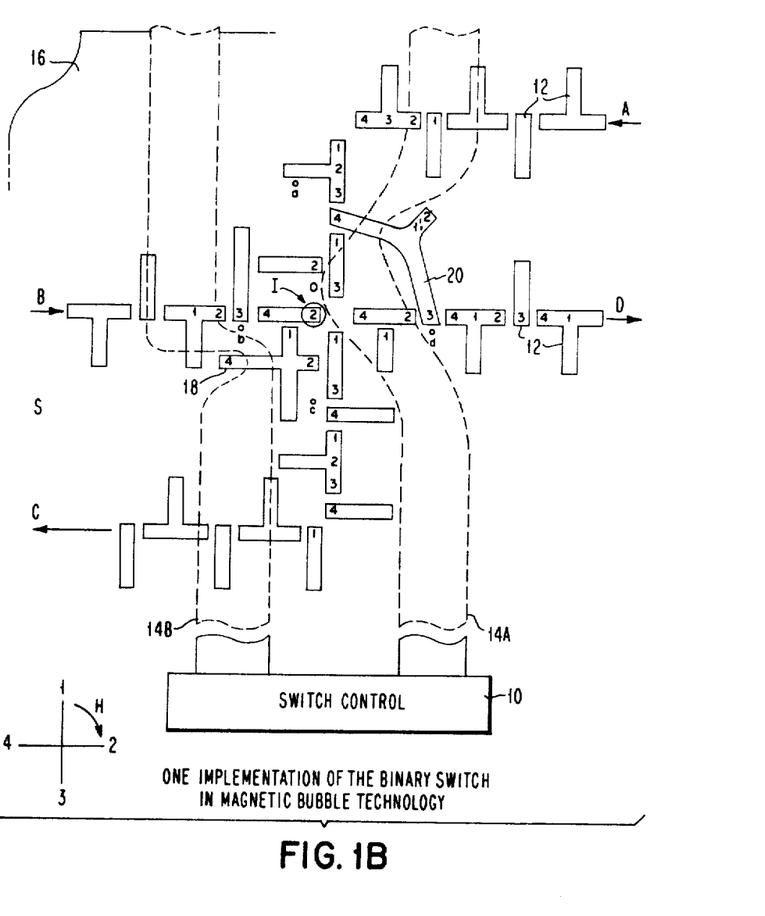
FIG. 1B sets forth one implementation of the switch in magnetic bubble technology,.

Referring again to FIG. 1A taken together with FIG. 1B it has been shown by Morrow, et al, U.S. Pat. No. 3,543,255, entitled "Single Wall Domain Apparatus Having Intersecting Propagating Channels", issued Nov. 24, 1970, that two bubble streams can cross each other at different phases of the same drive field cycle via an idler-type device without destructive interference. The required dual mode switch can be obtained as shown in FIG. 1B, elements 14AB, by modifying this device and adding conductors for control purposes. The switch itself consists of magnetic elements such as the T and I bars 12. As such, the switch is essentially the same as shown in the Morrow patent, except control means have been provided for changing the mode of operation of the switch. Thus, rather than having data streams A and B cross over each other at all times, the operation of switch S can be controlled so that the data streams A and B can be made to bypass one another. In FIG. 1B, conductors 14 A and B, connected to switch control 201 are used to place the switch in the bypass mode of operation. That is, when currents are present in these conductors, input stream A will enter switch S and leave via path D, while input stream B will enter switch S and leave via path C. Conductors 14 A and 14 B have portions of reduced widths so that they will produce different magnetic field gradients for diverting the bubble streams A and B in order to achieve the bypass operation. When no currents are present in conductors 14 A and B, the bubble streams A and B cross over one another. The cross-over operation depends upon the action of the bubble domain Idler located in the center of switch S. The bubble domain propagation path designated by B and D includes the Idler. The bubble occupying the Idler will be repelled out of the Idler by another bubble in the input data stream. This data bubble will then stay in the Idler position and be the next bubble to be replaced when a data bubble enters. Consequently, the Idler bubble is always replenished from input data bubbles. The Idler bubble is always replaced each time a data bubble enters the Idler. The input bubble streams cross one another, i.e., the data from A passes to C, and the data from B to D, at different phases of the drive field H cycle and, therefore, no destructive interference of the data streams occur.

More particularly, the dual mode switch S consists of magnetic elements 12 located on top of a magnetic medium 16 in which the bubble domain exist. Magnetic elements 12 provide propagation paths for the bubble streams A and B. The intersection point of the bubble streams A and B consists of an Idler. A bubble resides in the Idler and continuously circulates in the Idler in response to different orientations of drive field H. Conductors 14 A and B can be located either over the magnetic elements 12 or under them.

To explain the bypass operation, it is assumed that field H rotates in a clockwise direction as shown. Parenthetically, the time for one field rotation is called a bit time. At field phase 3, the leading bit position of input stream A is labeled "a", the leading bit position of stream B is labeled "b", the trailing bit position on path C is labeled "c", and the trailing bit position on path D is labeled "d". When control conductors 14 A and B are not activated, then switch S operates in the crossover mode. In this mode, the bit at position "a" will be connected to the bit at position "c", while the bit at "b" will be connected to the bit at "d". During activation of the control conductors, crossover Idler I is bypassed. If the bypass action is started at phase 3, a current through conductor 14B during field phases 4 and 1 will cause transfer of the bubble at bit position "b" to pole position 4' on magnetic element 18. The bubble remains there until field phase 2, at which time it will travel to position "c". Correspondingly, a current in conductor 14 A during field phase 3 steers a bubble at bit position "a" to bit position "b", pole position 3 on modified Y bar 20. When the bit is converted from the crossover mode to the bypass mode no excess bubble domain is left behind in the Idler except the Idler bubble itself. Additionally, no gap is created when converting from the bypass mode back to the crossover mode.

Figure 2A:
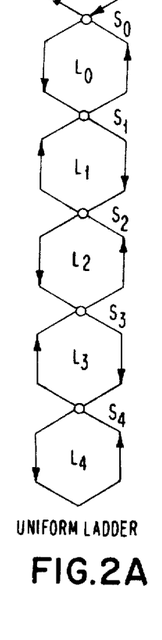
FIG. 2A illustrates a ladder of equal length loops within which the record in any loop can be switchably exchanged for the record in an adjacent neighbor loop.

Referring now to FIG. 2A, there is shown a uniform ladder. It consists of a linear sequence of N shaft register loops $\{L_i\}$. Adjacent loops $L_i$ and $L_{i+1}$, are linked by a dual mode switch $S_{i+1}$. For an N loop ladder, there are $N-1$ internal switches. A top switch $S_O$ is then used to link the ladder to the outside world. The collection of switches lies in a straight line which symmetrically subdivides the ladder into two equal parts. It should be observed that two adjacent loops have opposite flow directions.

The N-loop ladder can be used to hold N data items called records, each record consisting of $2m$ bits. One record is capable of being circulated in each loop. A format of record R is set forth in FIG. 2B. The format consists of a linear sequence of bits, subdivided into two halves. The first half designated FR (front of R) consists of bits ($R_0$ $R_{m-1}$), the second half consists of ($R_m - R_{2m-1}$). Further, the positions $R_0$, $R_m$, $R_{2m-1}$ are called the head, waist, and tail, respectively. In considering the behavior of the uniform ladder in a steadily shifting mode, it should be noticed that in one bit time, a given data bit will shift from one bit position to an adjacent bit position. If switch $S_i$ is part of a shift path, the destination position will depend upon the setting of the switch. If the setting is off, the data bit will remain in the loop. Turning the switch on will cause a crossing of the loop boundary. It is further observed that switch $S_i$ is without delay and its interposition along a path does not add to the shift delay.

Referring again to FIG. 2A, the setting of $S_i$ to "off" effectively subdivides a ladder into two uncoupled sub-ladders. The setting of all switches to "off" does yield N sub-ladders, each containing one circulating loop. Irrespective of the the initial arrangement at time $T_O$, if all of the switches $S_i$ are turned "off", the same arrangement will recur at the end of an integer number of periods.

Given one record per loop, if the switch $S_i$ is turned "on" while all other switches remain "off", then the contents of loops $L_{i-1}$ and $L_i$ will flow in exchange. After one period, the exchange will be complete. If $S_i$ is then turned "off" again, then an exchange of records has been made. Significantly, this exchange takes place without the need of a buffer. With the neighbor exchange mechanism used either one at a time of simultaneously involving many exchanges, arbitrary permutation of the records in the ladder can be achieved.

It is the thesis of this invention that a new fast transposition sorting scheme can be implemented on fixed length records in the uniform ladder.

In the conventional odd/even transposition sorting scheme, one assumes that unsorted records arrive as elements of a column vector. Further, it is assumed in the following discussion, that an increasing sequence is desired with the record having the smallest key at the top of the column upon exit.

Odd/even transposition sorting for N records is conducted in N stages, alternating between even and odd. For any given stage, let $R_p$ be the record in the pth loop. Then for $j = 0, 1, 2 \ldots, |(N/2)-1|$, (a) During an even stage, $R_{2j}$ and $R_{2j+1}$ are compared; the record with the smaller (larger) key will become the $R_{2j}$ ($R_{2j+1}$). Thus, a transposition occurs if the record pair has been found to be wrongly ordered.

(b) During an odd stage, $R_{2j+1}$ and $R_{2j+2}$ are compared; those with a smaller (larger) key will become $R_{2j+1}$ ($R_{2j+2}$).

The odd/even transposition sort is well knnwown in the computer field and is summarized by D. E. Knuth in "The Art of Computer Programming", Vol. 3, Addision Wesley Press, Massachusetts, 1973, LC 67-26020 at pages 241 and 640, that N stages are necessary and sufficient to sort the N given records whether one starts with an even or odd stage. Parenthetically, for $N = 2$ there is no odd stage at all. The number of comparators required is $N(N-1)/2$.

It is prudent to consider the new problem of efficient sorting using a uniform ladder. This differs significantly from the well-known odd/even transposition sorter above by having far fewer than $N(N-1)/2$ comparators, and by the serial data movement.

In the odd/even transposition sorter there are N physical stages, each used once; in the new ladder sorting scheme these N stages are folded into one physical ladder, to be used N times. Data transposition is done via the $(N-1)$ switches $\{S_k\}$ subdivided into odd subscripted and even subscripted classes, the $(N-1)$ switches are in turn controlled by a comparison mechanism. During the odd (even) stage, all even subscripted (odd subscripted) switches are set conditionally to start the transpositions, if any; and a switch, once set to "on" or crossover, will be permitted to stay for one full peroid to allow the serial records to complete the flow across the switch.

Another aspect of the uniform ladder sorting of the present invention is the loading and unloading of records, which occur one record at a time, and each record moves serially. This is in sharp contrast with the odd/even transposition sorter which loads all N records at once. The exploitation of this relatively slow data loading/unloading time will be shown to be a significant aspect of the present invention.

Figure 3:
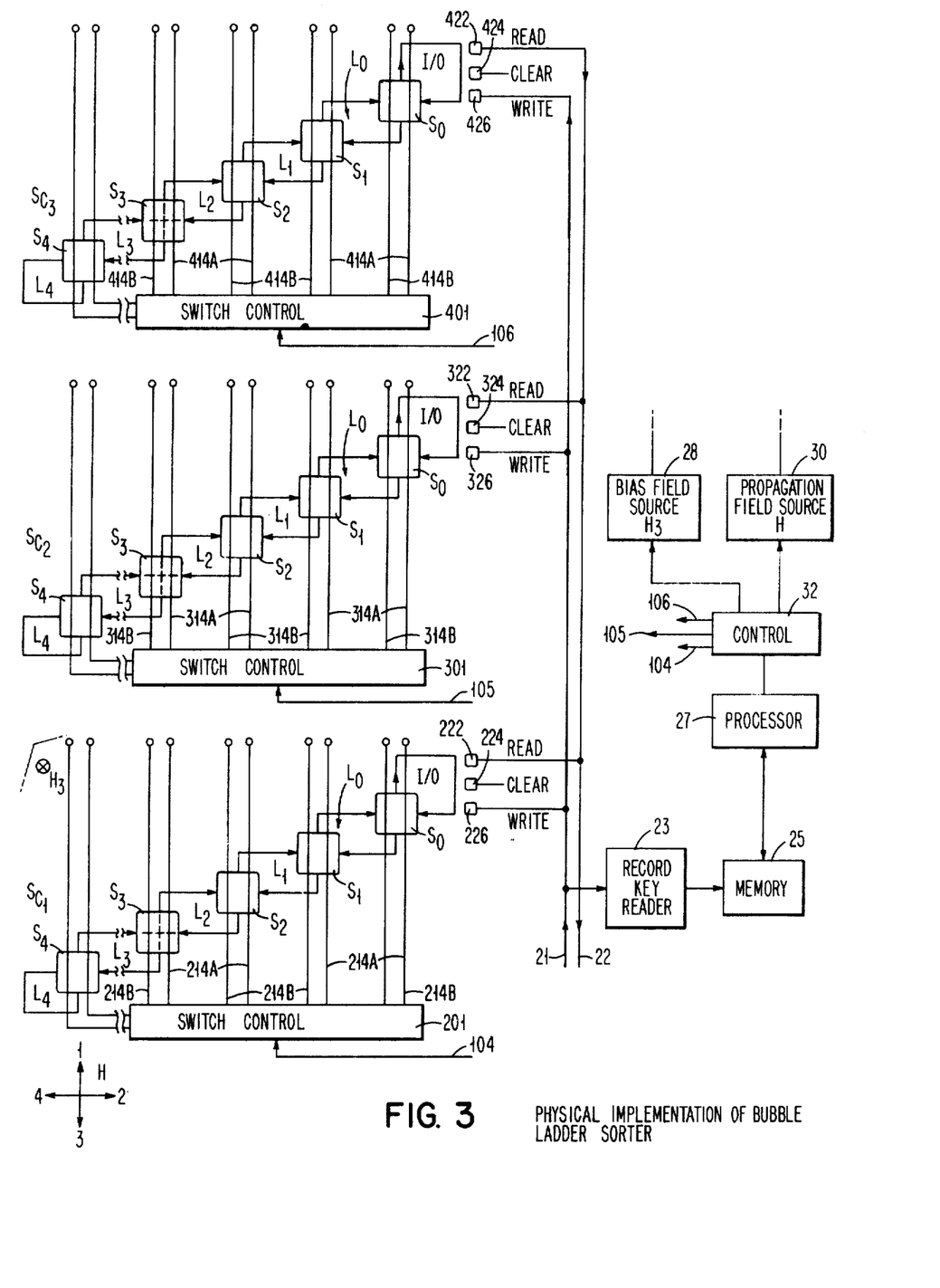
FIG. 3 discloses the logical implementation of a bubble multi-ladder sorter in relationship to an external memory and processor according to the invention.

Referring now to FIG. 3, there is shown a physical implementation of a bubble multi-ladder sorter using a three-ladder example. Each ladder consists of a sequence of bubble storage loops interconnected by switches as described above at the intersections between the loops. The provision of dual mode switches at the intersection of the loops enables data in the form of bubble streams to circulate around each separate loop or to be interconnected in the sequential fashion.

Referring, more particularly, to FIG. 3, each ladder in the network consists of a plurality of loops. In the invention, the actual number of loops in each ladder differs. For purposes of this discussion it is important to know that each of the loops are interconnected by dual mode switches $S_1$, $S_2$, $S_3$ and so on. Additionally loop $L_O$ is interconnected with an input/output loop I/O by switch $S_O$. Associated with the I/O loop are read circuits 22, a clear circuit 24, and a write circuit 26.

The switches have their modes of operation determined by the presence and absence of currents on the associated conductors i.e. 214A, 314A, 414A, and 214B, 314B, 414B. Currents in these conductors are under the control of a counterpart switch control unit 201, or 301, or 401. The control unit can operate all of the dual mode switches in the associated ladder selectively.

For a ladder structure using magnetic bubble domain technology, biased field source 28 provides a magnetic biased field $H_Z$ for stabilizing the size of the domains in magnetic medium 16. Propagation field source 30 provides a rotating magnetic field H in the plane of the magnetic medium for movement of the domain. A control circuit 32 provides timing and control signals from processor 27 to each of the switch control units 201, 301, and 401 over respective paths 104, 105, and 106. Control unit 32 also provides timing and control signals to biased field source 28, propagation field source 30 and data source 41 and data sink 43 over paths 107 and 108.

Biased field source 28 generating a biased field $H_Z$ can be readily implemented by a cuurrent-carrying coil, a permanent magnet, or by an exchanged coupled layer located on the magnetic field 16. Propagation field source 30 can be conveniently implemented by a plurality of current carrying coils located around the magnetic medium 16.

In the specification, "on" and "off" designate the crossover status of the switch, where "on" means crossover and "off" means avoidance. Unless explicitly assumed otherwise, a switch is assumed to be normally "off". The ladder design in the apparatus described in H. Chang et al, U.S. patent application Ser. No. 566,378, involves one small loop and N large, double-sized loops linked by dual mode switches. All but one of the switches are set in synchronism. In the embodiment of this invention, however, the switch controls are more flexible and the loop sizes are uniform.

The sorting phase using a uniform ladder shall now be discussed in terms of the multi-ladder diagram FIG. 3 using only one ladder.

It is presumed that the ladder has been loaded and filled, and that the key for each record has been copied into external memory 25, as can be done during the loading operation. The external processor 27 using the copied keys develops appropriate control signals for ultimately turning the switches on or off in order to effectuate sorting.

Figure 4A:
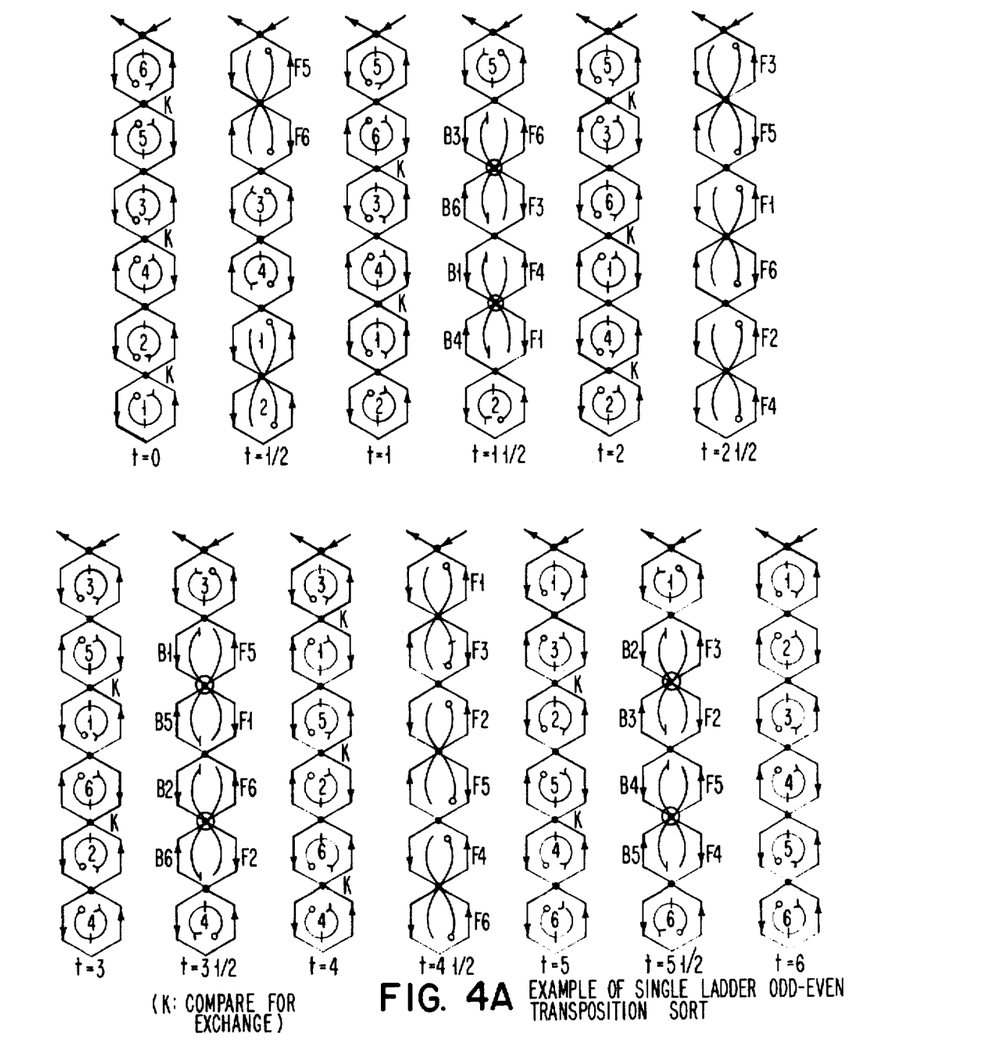

Referring now to FIG. 4a, there is shown an example of single ladder odd/even transposition sorting. All odd subscripted switches are active during even stages and all even subscripted switches are active for all odd stages. A transposition is induced by the proper setting of $S_j$ under processor control signal. Loop $L_j$ is termed inferior to loop $L_k$ if the key referring to the record in $L_j$ is smaller than that referring to the record in $L_k$.

In an N-loop uniform ladder, the following method will sort the N records in N stages whether one begins with an odd or even stage.

During an even stage, every odd subscripted switch, $S_{2j+1}$ will be turned on, if and only if $L_{2j+1}$ is found to be inferior to $L_{2j}$. The switch is off otherwise. This is done for all meaningful $j$.

The method continues such that during an odd stage, every even subscripted switch, $S_{2j+2}$ will be turned on, if, and only if, $L_{2j+2}$ is found to be inferior to $L_{2j+1}$. It is off otherwise. This is done for all $j$. Next, a decision regarding the switch setting is in force for exactly one whole period, i.e., 2m bit times. At the end of this interval, the switch is turned off unless overruled by a new decision. Lastly, the beginning of each period marks the beginning of a new stage in the present scheme.

Each switch firing corresponds to the start of a true odd/even transposition sort which takes exactly one period to complete. If a simple comparator is used to control the record movement between two adjacent loops ($L_{j-1}$, $L_j$), then only a total of (N −1) comparators would be needed, in sharp contrast to the N(N−1)/2 comparators needed in the odd/even transposition sort.

Advantageously, the single ladder transposition sort time can be further reduced by almost one-half. In order to achieve this quick sorting in an N loop uniform ladder, if the beginning of each half period, rather than a full period, starts a new stage, then the ladder will sort N records in (N + 1)/2 periods whether one begins with an odd or even stage.

Consider the movements of the leading half of each record. If allowed to cross over during an odd stage, it takes exactly half a period to vacate one loop and enter another. At the end of the half period, a record will occupy an entire half of the new loop and be poised to enter yet another loop at an even stage if need be. The same is true if one starts with an even stage. In this regard, a sequence of true transpositions will be done correctly for the half record. Now suppose the half record is not permitted to cross a switch during an odd stage. In half a period, it will have rotated by half a loop and will be facing the switch needed for an even stage comparison. It may then flow across as a result. If it does not flow through in another half period, it will be poised to obey an odd stage decision again. In other words, the half record always moves correctly in the sense of odd-even transposition sorting at every stage. Now, the other half of the record always follows the leading half faithfully, as all the operations described satisfy the requirements for preserving the intactness of records and will not dismember any records.

In this fast transposition sorting method, a decision for crossing into a new loop may be made before an operand has fully entered the old loop. This has a bearing on the manner of sorting by explicit sampling later to be discussed.

Referring now to FIG. 4a, there is shown a single ladder transposition sort of a sequence of records having keys designated respectively 6, 5, 3, 4, 2, 1 and occupying from top to bottom counterpart loops at time $t =$ 0. The transposition sorting is accomplished in 6 full periods or loop cycle times with the records having the order from top to bottom of 1, 2, 3, 4, 5, and 6.

Figure 4B:
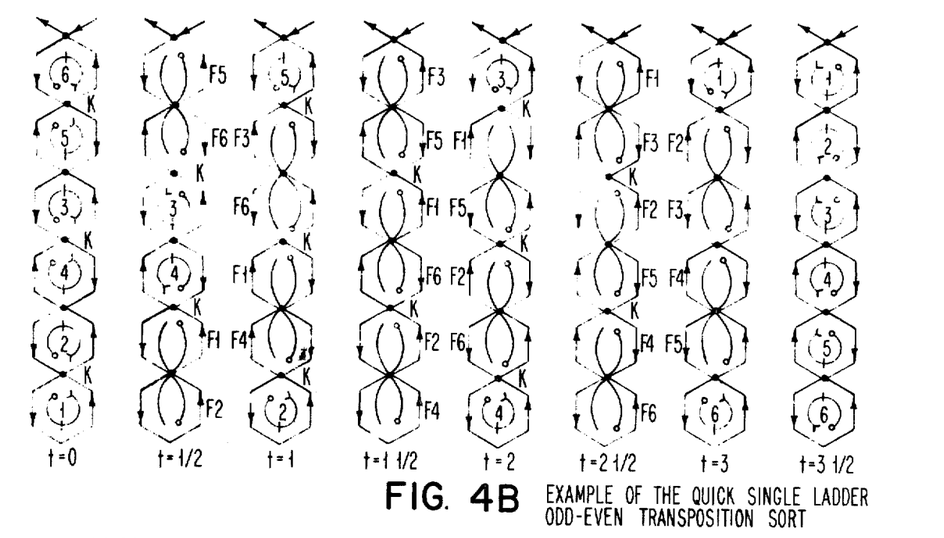
FIG. 4B shows an accelerated version of the same sequence.

Referring now to FIG. 4b, there is shown an example of the quick single ladder transposition sort. At $t = \frac{1}{2}$ switches $S_2$ and $S_6$ are activated in order to replace 6 by 5 and 2 by 1. This record exchange is completed time $t$ = 1. At time $t$ = 1.5, odd stages $S_3$ and $S_5$ are activated in order to exchange 6 by 3 and 4 by 1. This exchange is completed at $t$ = 2.

At time $t$ = 2.5, switches $S_2$, $S_4$, and $S_6$ are activated for replacing 5 by 3, 6 by 1, and 4 by 2. This exchange process continues until $t$ = 6. As is apparent for N = 6, the sorting can be performed in (N + 1)/2 = (6 + 1)/2 = 3.5 periods. Note that it takes N full periods to load N records into the N stage ladder and N full periods to unload. In the case of the fast sort the load/unload time is about four times that of the sorting time.

So far, only deputized sorting has been considered. In this form of sorting, the keys of the records are copied into a memory external to the ladder with a processor mechanism developing the necessary loading, sorting, and merging signals for controlling the appropriate switches. What is now considered is a single ladder transposition sort with keys embedded in the records themselves without being copied before the sorting phase. Suppose the records already reside in the ladder, explicit and dynamic access from the ladder loops would appear to be desirable. This requires that each loop be provided with a mechanism for copying the correct key fields at a predetermined time. Also, the keys must be sampled and compared in advance of the switch actuations.

Whether explicit sampling is employed or not, it is desirable for the records to bear a definite relationship to each other. For sequentially loaded records there exists a natural initial synchronization. This can be seen in the following illustration. If the sequence of records enter the ladder in a bit-serial manner starting at time $t_0$, the loading sequence requires the following switch setting for $i = 0, 1, \ldots, (N-1)$; $S_i$ is on during $(t_0 + i/2, t_0 + N - i/2)$, and off otherwise.

Figure 5A:
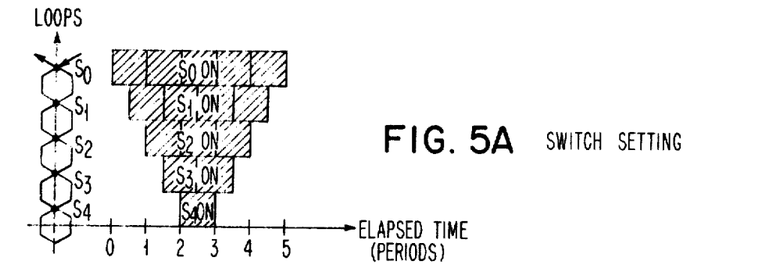
FIGS. 5A and 5B show the switch settings and record movement in a single ladder sorter, for the explicit loading and unloading of the records.
Figure 5B:
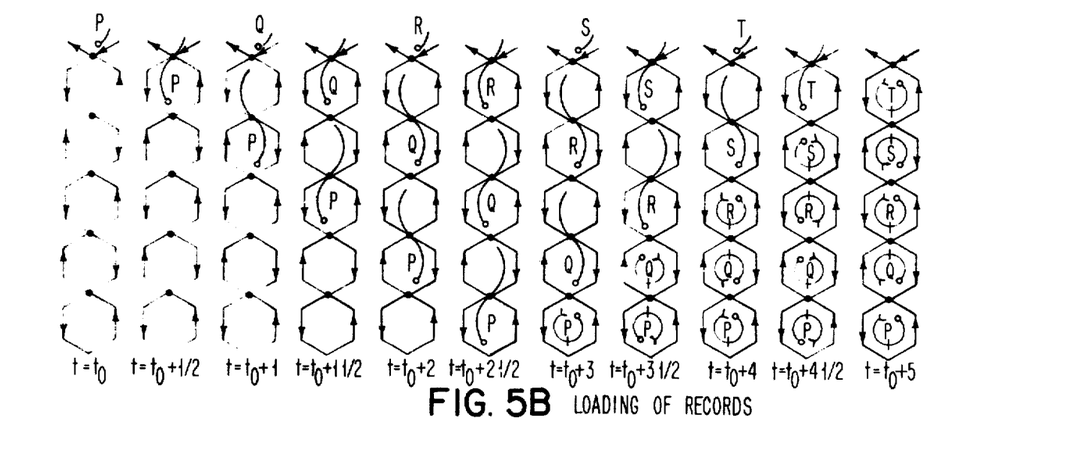

Referring now to FIG. 5a, there are shown the switch settings for loading the five loop ladder. In FIG. 5b detailed record movements are set forth. The total loading time is N. It should be appreciated that in a description of a bubble sorter engine of the "input, sort output" type, the loading (input) and unloading (output) of the records must be taken into account explicitly.

The loading of the ladder starts at time $t_0$. It is completed at time $t_0 + N$. One cycle earlier at time $t_0 + N - 1$, the odd/even transposition can already start with an odd stage. It will be observed from FIG. 5b that at every half period interval, the conditional transpositions alternate between odd and even subscripted switches. This is precisely the same series of switch actions previously described in connection with the fast transposition sorting method.

As may be recalled, the quick single ladder transposition sorting method took $(N + 1)/2$ periods to complete at time instant $t_2 + (N + 1)/2$, where $t_2 = t_0 + N - 1$. To unload the sorted records head first, the unloading must start an integral number of periods after $t_0$. This can match the sort completion instant $t_2 + (N + 1)/2$ only if N is odd. For an even N, extra waiting would appear necessary. However, by starting the output a half period earlier, i.e., at time $t_2 + N/2$, the output would already be correct. For odd N the output can indeed occur precisely upon sorting completion, but one period before that time, while sorting is still in progress for loop $L_1$ and below, the record in $L_0$ is already poised for exit. Hence, the output may be started at time $t_2 + (N-1)/2$ for odd N. In general, the "output ready" time is $t_3 = t_2 + (N-1)/2$.

The above discussion leads to the following observation; that in using a fast transposition sorting scheme to load and sort N records in an N-loop uniform ladder starting at loading time $t_0$, then a correct output will begin to emerge (N − 3/2 periods after nominal loading completion time $(t_0+N)$.

The operation sequence for this method may be tabulated as follows:

$t_0$ (start loading sequence)

$t_2 = t_0 + N - 1$ (start fast single ladder odd even sort with stage one)

$t_1 = t_0 + N$ (the ladder loading is complete)

$t_3 = t_2 + \lfloor(N-1)/2\rfloor = t_1 + \lfloor(N-3)/2\rfloor$ (output is ready to emerge)

$t_4 = t_2 + (N+1)/2$ (sorting is completed)

$t_5 = t_3 + N = t_0 + 2N + (N-3/2)$ (output completed)

Figure 6A:
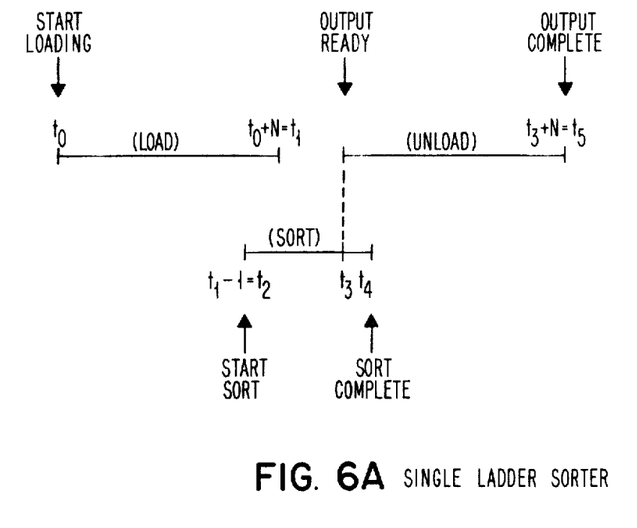
FIG. 6A shows the overlapped timing relationship for accomplishing the load, sort, and unload using a single ladder sorter.

Referring now to FIG. 6A, where the above named relationships are diagramatically shown, it is apparent that the pure processing time which is not otherwise overlapped by the input/output is equal to $t_3 - t_1 = t_5 - t_0 - 2N = \lfloor(N-3)/2\rfloor$ periods.

It is further to be noted that at time $t_2$, the arrangement is essentially one in which the records are filed one to a loop. The records in loops $L_{j-1}$ and $L_j$ are poised to cross switch $S_j$ for $j = 1, 3, 5$. This is suitable for starting the quick sorting operation with an odd stage. It should be noted then, that the pure processing time is already 0 for N=3. For N=2 there is no odd stage, and stage 2 is the only comparison stage. For N=1 there is no comparison at all. Thus, no pure processing time is consumed for N less than or equal to 3.

Reference is now made to a two ladder input-sort-output apparatus. It comprises two single ladder input-sort-output ladders termed left and right. The first $k$ records are loaded into the left ladder and the remaining $b = N - k$ records in the right ladder. Partial overlap of the sorting of $k$ records in the left ladder with the loading and the sorting of $b$ records in the right ladder can be achieved to yield two separately sorted ladders. It is still necessary to merge the contents of the separately sorted ladders. This can be accomplished by comparing the top occupants in the two ladders and selecting for output the one having, for example, the smaller key, and repeat the process until all N records have been transmitted in this binary merge. Accordingly, it is the object in the two ladder case to select $k$ and $b$ so as to minimize the amount of sort time that is not overlapped with input time of N periods and output time of N periods.

If one now relates the requirements back to the discussion of the single ladder input-sorting-output apparatus, the times should be designated as follows:

$t_{L0}$ = initial load time.

$t_{L3}$ = instant of left ladder output ready = $t_{L0} + k +$ unoverlapped sorting time for $k$ records = $t_{L0} + k + \lfloor(k-3)/2\rfloor$.

$t_{R0}$ = initial load time for right ladder = $t_{L0} + k$.

$t_{R3}$ = instant of right ladder output ready = $t_{L0} + k +$ (load time for $b$ records) + (unoverlapped sort time for $b$ records) = $t_{L0} + k + \lfloor(3b-3)/2\rfloor$.

Figure 6B:
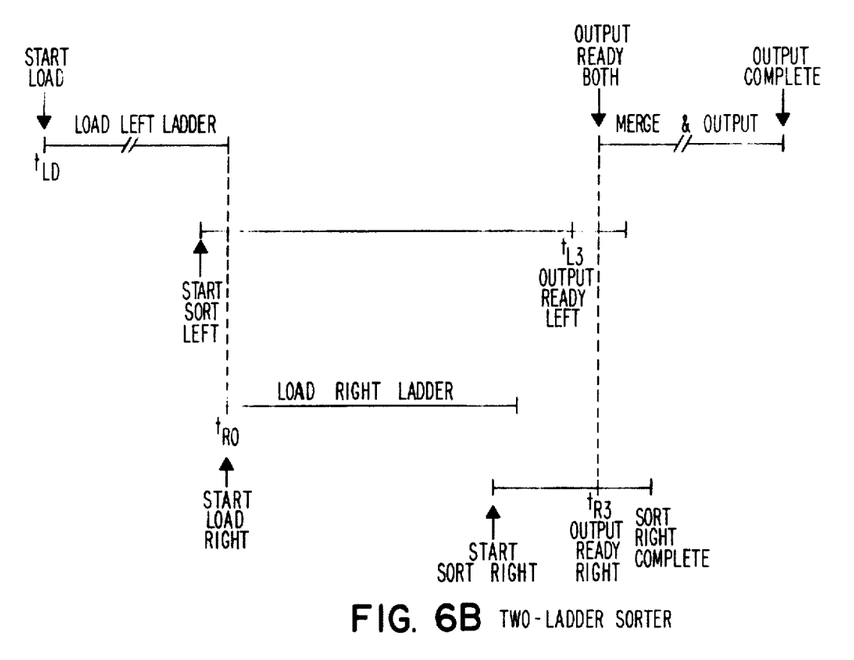
FIG. 6B advantageously shows the overlapped timing relations utilizing a two ladder structure according to the invention.
Figure 6C:
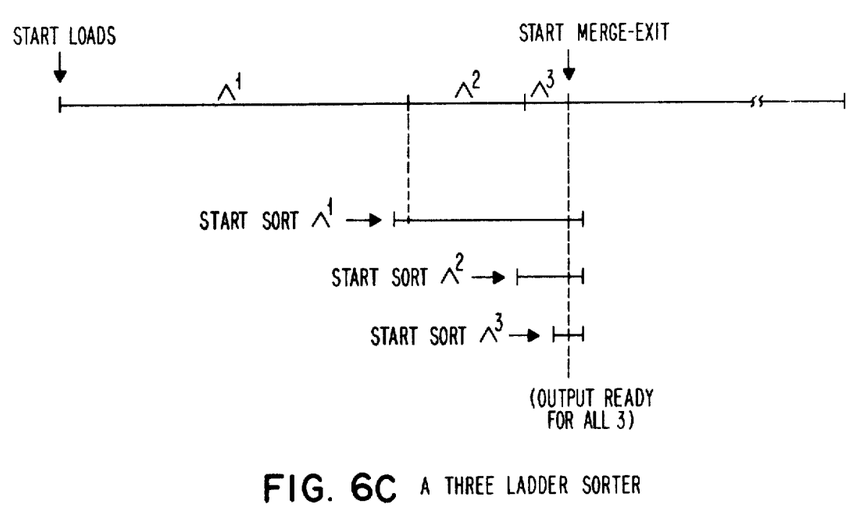
FIG. 6C shows an example of the use of a multi-ladder sorter in which the sorting time is completely overlapped by the loading of the records.

Referring now to FIG. 6B, it is apparent that the left ladder is ready for output at time $t_{L3}$. The right ladder output at time $t_{R3}$. At the time max$[t_{L3}, t_{R3}]$ both of the ladders are ready for output. Thus, a comparison of the records having the lesser weighted keys in the ladder and the output of the least among these constitutes a binary merging of the contents of the ladder. After one period, the same situation occurs with one fewer record. After a total of N output periods, both ladders are completely empty.

Referring again to FIG. 6B, the total processing time $\tau$ is $\tau = \max [t_{L3} - t_{L0}, t_{R3} - t_{L0}] + N = k + \max [\lfloor(k-3)/2\rfloor, \lfloor(3b-3)/2\rfloor] + N$.

The design objective is, of course, to select the best $b$ to minimize $\tau$. This is the same as minimizing the net unoverlapped processing time $\Delta \tau$. It has been found for the two ladder case that $b$ equals $\lfloor(N+2)/4\rfloor$ and $k = N - b$ equals $\lfloor(3N-2)/4\rfloor$ with $\Delta \tau$ equal to $\lfloor(N-5)/8\rfloor$. These choices are advantageous for N ≥ 4. In the case of N ≥ 3, one ladder should be adequate with zero unoverlapped sorting time.

As an illustrative example, suppose it is desired to sort 42 records in a two ladder sorter according to the principles of the invention. It follows that N=42, then $b = \lfloor(N+2)/4\rfloor = 11, k = N - b = 31$. The unoverlapped sorting time for the $k = 31$ records is $\lceil(31-3)/2\rceil = 14$ periods. The total processing time for $b = 11$ records is $11 + \lceil(11-3)/2\rceil = 15$ periods. It follows therefrom that $\tau = 31 + \max[14, 15] + 42 = 88$. Accordingly, $\Delta\tau = 88 - 2(42) = 4$. This is exactly $\lfloor(42-5)/8\rfloor$.

It further has been found that the the principles of the invention can be extended to the multi-ladder input sort output case. For $q$ ladders, respectively designated $\Lambda^1$, $\Lambda^2, \ldots, \Lambda^q$, each of the ladders being a single ladder input-sorting-output apparatus according to the previous discussion. The number of records to be assigned to the ith ladder $\Lambda^i$ is $n_i$. It is desired to load ladder $\Lambda^i$ while the ladders $\Lambda^1, \ldots, \Lambda^{i-1}$ are undergoing sorting and the ladders $\Lambda^{i+1}, \ldots, \Lambda^q$ remain empty. By the time the last ladder is loaded and sorted, then all the ladders will have been sorted and a $q$ way merge can be made.

If $Q_i$ is the number of records remaining after loading the ladder $\Lambda^i$, then $Q_{i-1} = n_i + Q_i$. It is necessary that $n_i$ be selected such that the sorting time for $n_i$ is completely overlapped by the loading time for the remaining records $Q_i$. It is also desired to minimize $q$, the total of ladders, by making $n_i$ the largest number with this overlap property.

Loading of each ladder means the removal of a number of waiting records. When there remain 3, 2, or 1 records, they are loaded in the last ladder. The sorting time for the last ladder, as previously shown, is zero.

It is desired to select a $Q_{i-1}$ which is non-negative and minimizes $Q_i$. Relatedly, it has been found that the condition can be met if $Q_0 = N, Q_i \geq \lfloor Q_{i-1}/3\rfloor$ and $n_i = Q_{i-1} - Q_i$. The equality sign yields the optimum assignment of records to a ladder and reduces the number of unassigned records by at least a factor of 3. In general, the number of ladders needed is $q = \lceil 1 + \log_3(N+1)/4\rceil$.

Let us assume it is desired to process $N = 35$ records. $Q_1 = \lfloor 35/3\rfloor = 11$ records remain after loading ladder $\Lambda^1$. This means that $n_1 = 24$ records have been assgined to that ladder. The records remaining after assignment of the second ladder $= Q_2 = \lfloor 11/3\rfloor = 3$. The number of records $n_2$ assigned to ladder $\Lambda^2$ is equal to $11 - 3 = 8$. Since $Q_2$ is no greater than 3, then the remaining records are assigned to the last ladder $\Lambda^3$. The number of ladders $q = \lceil 1 + \log_3((N + 1)/4)\rceil = \lceil 1 + \log_3((35 + 1)/4)\rceil = 3$. There is no visible overall processing time, as can be verified.

Figure 2B:
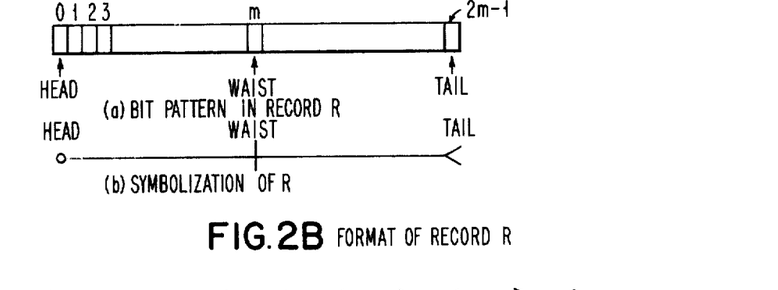
FIG. 2B sets forth the multi-bit format for the fixed length records storable in respective equal length loops.

Referring again to FIG. 3, in the multi-ladder sorter, electrical pulses, representing records including key and data fields formatted as per FIG. 2B, are impressed upon path 21 from data source 41. Each electrical signal variation is in turn also impressed upon transducer 226, 326 and 426 at approximately the same time so that the writing of a record into a ladder is the equivalent of converting an electrical signal sequence into a bubble stream equivalent in the I/O loop of each of the ladders. The reading of information from the I/O loop occurring at respective transducers 222, 322 and 422 results in a magnetic bubble to electric signal conversion onto path 22 for transmission to data sink 43.

The read, clear, and write circuitry is well known in magnetic bubble domain technology and reference is made, for example, to H. Chang et al, U.S. Pat. No. 3,689,902, issued Sept. 5, 1972, and entitled "Cylindrical Magnetic Domain Decoder". That reference shows a current loop clear means for removing information from a shift register loop. Also shown are various controlled bubble domain generators. Sensing is provided by conventional magnetic bubble domain sensors such as magnetoresistive devices.

As each record is impressed upon path 21, the key field is simultaneously read by record key reader 23. Such a reader will, accordingly, enter they key in a predetermined location of memory 25. The copying of keys into an external memory 25 signifies the beginning of the deputized sorting process. Hereinafter, processor 27 will develop control signals for actuating the appropriate switches responsive to the keys stored in the memory. The processor may be of the stored program controlled type in which routines for executing the functions of loading and filling consecutive ladders, sorting, and merging are defined.

In consideration of the foregoing discussion, there shall now be described the general design modality for using a number of ladders to sort N records, each ladder being associated with sufficient computing power and storage. In this regard, the record length is $2m$, equalling the loopsize in each ladder; the capacity in the ith ladder is $c_i$ records; the number of ladders provided is designated by $q$; the total capacity of the collection of ladders is $$\sum_{i=1}^{q} c_i = C.$$

Ideally, ith ladder capacity will be chosen if $c_i = \lfloor c_{i-1}/3\rfloor$ with $q = \lceil 1 + \log_3((C+1)/4)\rceil$. Other choices, however, are possible.

When such a system is used to sort N records, $N \leq C$, some of the ladders may not be used at all, and some will be used below full capacity. For the ith latter, only $n_i$ loops counting from the top are used. Before the ladder is loaded, $n_i$ is bounded by the following relations:

$Q_0 = N$,
$n_i = $ minimum of $\{(c_i, 2Q_{i-1}/3)\}$,
$Q_i = Q_{i-1} - n_i$.

An equivalent scheme is:

$Q_0 = N$,
$Q_i = $ maximum of $(Q_i - c_i, \lfloor Q_{i-1}/3\rfloor)$,
$n_i = Q_{i-1} - Q_i$.

$Q_i$ is the number of remaining records to be loaded into the ith ladder and beyond, after the $(i-1)st$ ladder has been loaded. Again, optimum efficiency will be gained by choosing equal signs. There are three distinct types of activities for the ith ladder, namely, data entry (starting at time $t_{Ei}$)
permutation (starting at time $t_{pi}$)
data merging — exit There should be associated with the ith ladder the following registers of $(c_1 + 1)$ bits each:

a size register $Z_i = Z_i(0), Z_i(1), \ldots Z_i(c_i)$, the number of leading 1's of which indicates the effective length being used;
a data entry activity register $E_i = E_i(0), \ldots E_i(c_i)$;
a permutation activity register $P_i = P_i(0), \ldots P_i(c_i)$;
an exit activity register $X_i = X_i(0), \ldots X_i(c_i)$;
a switching status register $W_i = W_i(0), \ldots W_i(c_i)$.

$W_i(k)$ controls the current status of switch $S_k$ in the ith ladder. If $W_i(k) = 1$, the switch is on (in the crossover mode); if $W_i(k) = 0$, the same switch is off (in the bypass mode). Every half period, an updated $W_i$ is sampled for the explicit control of all switches in the ladder; prior to this, in the updating pass $W_i(k)$ is replaced by $E_i(k) v P_i(k) v X_i(k)$.

The system also should have enough storage to contain the keys of all the records being sorted; the storage $K_i(k)$ contains the key or the record in the kth loop of the ith ladder. Means should be available to mark the storage contents valid; invalid keys are ignored by the comparison mechanisms.

A control mechanism oversees all activities, and has access to all $K_i(k)$ and to all registers. The control mechanism determines the assignments of records to all ladders, causes the comparisons to be performed, and in the merge phase, selects records to enter the merge stream.

Prior to data entry, all bits in all registers are cleared. The effective length $n_i$ of the ith ladder is chosen by the formulas given earlier. All times are measured in periods; one period being the time for one bit to circulate a given loop exactly once, with the boundary switches off.

DATA ENTRY

Data entry begins at time $T_{Ei}$ for the *ith* ladder, with $n_i$ records entering in sequence, one following the other. As they enter, (or even before then), the key of the kth entering record is placed in $K_i(k)$ and marked valid. $E_i$ is set by the procedure:

At $t = t_{Ei} + k/2$, $0 \leq k \leq n_i - 1$, $E_i(k)$ is set to one, all other bits in $E_i$ are unchanged;

At $t = t_{Ei} + (n_i + k)/2$, $1 \leq k \leq n_i$, $E_i(n_i - k)$ is set to 0, all other bits in $E_i$ are unchanged.

Then at $t = t_{Ei} + n_i$, all records have entered the ith ladder, and $E_i$ is automatically cleared to all zeros.

DATA PERMUTATION $P_i$ is set by the following procedure which also changes $K_i$:

At time $t = t_{Pi} + r$, $0 \leq r \leq n_i/2$ the contents of $K_i(2j)$ is compared against that of $K_i(2j+1)$ for all meaningful $j$; if the ordering is already correct, $P_i(2j+1)$ is set to 0; else the ordering is incorrect, the remedy consists of swapping the contents of $K_i(2j)$, $K_i(2j+1)$, and setting $P_i(2j+1)$ to 1.

At time $t = t_{Pi} + r + 1/2$, $0 \leq r \leq \lfloor n_i/2 \rfloor$ the contents of $K_i(2j+1)$, $K_i(2j+2)$ are compared, for all meaningful $j$; if the ordering is already correct, $P(2j+2)$ is set to 0, else swap the contents of $K_i(2j+1)$, $K_i(2j+2)$ and set $P_i(2j+2)$ to 1.

At time $t = t_{Pi} + (n_i - 1)/2$, , no more active comparisons are made; if $n_i$ is even, clear $P_i(2j+1)$, if $n_i$ is odd, clear all $P_i(2j)$, in both cases for all meaningful integer $j$.

At time $t = t_{Pi} + (n_i + 1)/2$, the permutation is complete and all $P_i$ bits should be cleared.

MERGE EXIT

For exit on merging, one needs a procedure to allow single records to emerge upon signalling by the control mechanism which may occur at irregular times, but can be as frequency as once every loop cycle. The following scheme is feasible, involving $X_i$ and some other register, which one conveniently chooses to be $E_i$.

The pair of corresponding bits $E_i(k)$, $X_i(k)$ represents a two-bit binary value;

1,1 (never occurs);

1,0 means 2: climbing activity initiated, and takes two half periods to complete;

0,1 means 1: climbing continues, taking one-half periods to complete;

0,0 means 0: no climbing activity.

The merge part of the control mechanism starts at time $t_X \geq t_E + N$. For the jth step, at $t = t_X + j$, with $0 \leq j \leq N - 1$, the mechanism examines the valid set of $\{K_i(0)\}$ for all $i$ to select the most appropriate one (say, the smallest key). If $K_i(0)$ is selected, then the top record in the ith ladder should enter the merge stream. This is specified by:

Setting $E_i(0)$ to 1,

Moving valid contents of $K_i(j+1)$ to occupy $K_i(j)$ for all meaningful integer $j$ just before the periodic updating of the switch status register $W_i$ to ensure the correct use of the new $E_i(0)$ setting before it is altered.

The act of merger can be done in a number of ways. The simplest way is to sense the information upon output from ladder $i$, and recreate the information as input to the merge stream. Other methods may create difficult geometrical placement problems.

$E_i, X_i$ need to be updated periodically, every half cycle, after ladder $i$ is selected for merger. The updating pass can occur after the updating of $W_i$ but before any new setting of $E_i(0)$ by the merge control.

Each time a record leave the effective bottom loop of ladder $i$, the effective size of the ladder should be reduced by one, with the new bottom sealed off (with an "off" switch setting) to prevent data leakage. As the effective portion of ladder $i$ is indicated by a string of 1 bits in $Z_i$, the last 1-bit of this string should be changed to a zero. This can be done conveniently by inserting a conditional updating step for $Z_i(k)$ during the updating of $E_i, X_i$.

The following is a feasible updating scheme:

Whenever $Z_i(k) \cdot X_i(k) = 1$, then $Z_i(k+1)$ replaces $Z_i(k)$, for all $k$;

$E_i(k) \cdot Z_i(k)$ replaces $X_i(k)$, for all $k$;

$E_i(k) \cdot Z_i(k+1)$ replaces $E_i(k+1)$, for all $k$;

then $X_i(k) \lor E_i(k)$ replaces $E_i(k)$, for all $k$.

This way each setting of $E_i(0) = 1$ will trigger a sequence of events causing data to climb up ladder $i$ by one loop. The effective size indication is decreased by one appropriately through the conditional updating of $Z_i$. During this sequence $E_i(0)$ can again be selected, but no error will occur.

When ladder $i$ becomes empty, $Z_i(0)$ will be equal to 0 automatically. This is one of the ways of marking the contents of $K_i(0)$ invalid, and the latter should not participate in further merger comparisons.

When all $K_i(0)$ contents become invalid, the merger will be complete. This needs to take no more than N periods after merger starts at $t_X$.

The following are efficient choices of times, starting with loading at $t_{El}$.

$$t_{Ei} = t_{El} + \sum_{j=1}^{i-1} n_j, i \geq 2 \text{ (entry completes at } t = t_{El} + N\text{)}$$

$t_{Pi} = t_{Ei} + (n_i - 1)$ $t_X = t_{El} + N$.

The multi-ladder control scheme applies to the special cases of one and two ladders in exactly the same manner, with the possible exception of the length assignment and the simplification of the merge-exit phases. For the two-ladder case, to achieve complete lap of sorting time, the number of records that can be sorted cannot exceed 11, with $n_1 = 8$, $n_2 = 3$. If the number of records should exceed 11, full overlap is not possible. The assignment of $n_1 = k = \lfloor (3N-2)/4 \rfloor$ and $n_2 = N - k = \lfloor (N+2)/4 \rfloor$ will achieve maximum overlap, however with net unoverlapped sorting time of $\lfloor (N-5)/8 \rfloor$ periods.

In the other particular case of a single ladder transposition sorter, the multi-ladder scheme can be followed with $q = 1$ with no change, except there is no choice in the ladder assignment, and $n_1 = N$; nor is there any complication in merging.

In the particular case of an already loaded single ladder, everything can follow the multi-ladder case with $q = 1$, with the data entry part completely bypassed; if, further, unloading is not necessary, the merge-exit part can clearly be eliminated as well.

While several preferred embodiments of the invention, including a general design modality have been described and illustrated, these are not intended to be of limiting effect. It is intended to cover all modifications which would be apparent to one skilled in this art and which comes within the spirit and scope of the invention.

We claim:

1. In an apparatus for rearranging N identifiable $2m$ bit equal fixed length records, said apparatus including an externally controllable permutation network; and information handling means adapted to respond to the records in the order of their arrival for loading the records into the network, for developing and applying control signals to the network so as to effectuate the physical rearrangement of the records, and for unloading the records from the network, the control signals being derived from comparisons of record indicia according to a predetermined algorithm; wherein the improved permutation network comprises:

$q$ sorting ladders, each of whose sorting time being a linear function of the number of records to be sorted, where $q \geq \lfloor 1 + \log_3(N+1)/4 \rfloor$, the $i$th ladder $i \leq q$ includes:

$n_i$ equal length shift register loops, $n_i$ being constrained such that $$\sum_{i=1}^{q} n_i = N, \; n_i = Q_{i-1} - Q_i, \; Q_o = N, \; Q_i \geq \lfloor \frac{Q_{i-1}}{3} \rfloor,$$

$Q_i$ being the remainder after assigning $n_i$ to the $i$th ladder, if $Q_i \leq 3$, then $n_{i+1}$ can be set equal to $Q_i$, the $i$th ladder further includes:

a plurality of selectively operable dual mode switches connecting the loops such that each loop has no more than two adjacent switchable neighboring loops, and upon any boundary switch being set into a first mode responsive to a control signal, then the adjacent loops are cross connected in order to facilitate an exchange of any records circulating therein, upon the boundary switches to any loop being set into a second mode also responsive to a control signal, then the loop is maintained as a circulation path, one end loop of the ladder and the associated boundary switch coupling the information handling means and being operative as an input/output port; and the permutation network further comprising:

clocking means for causing all the loops to move their contents in synchronism.

2. In an apparatus according to claim 1, wherein the information handling means includes means for serially loading and unloading N records into and from the aggregate of the $q$ ladders, said $q$ ladders being all respectively loaded or all respectively unloaded in the order of decreasing record capacity.

3. In an apparatus according to claim 1, the information handling means includes means for $q$ way merging the records from the ladders.

4. In an apparatus according to claim 1, each loop has a capacity greater than or equal to the record size.

5. In an apparatus for rearranging N identifiable $2m$ bit equal fixed length records, said apparatus including an externally controllable permutation network; and information handling means adapted to respond to the records in the order of their arrival for loading the records into the network, for developing and applying control signals to the network so as to effectuate the physical rearrangement of the records, and for unloading the records from the network, the control signals being derived from comparisons of record indicia according to a predetermined algorithm; wherein the improved permutation network comprises:

a first and a second sorting ladder, the ladders respectively including $n_1$ and $n_2$ equal length shift register loops, where $n_1 + n_2 \geq N$, $n_1 \geq \lfloor (3N-1)/4 \rfloor$, $n_2 \geq \lfloor (n+1)/4 \rfloor$; each ladder further includes a plurality of dual mode switches; said switches connecting the loops such that each loop has no more than two adjacent switchable neighboring loops, and upon any boundary switch being set into a first mode by a control signal, then the adjacent loops are cross connected in order to facilitate an exchange of any records circulating therein, upon the boundary switches to any loop being set into a second mode also responsive to a control signal, then the loop is maintained as a circulation path; one end loop of each ladder and the associated boundary switch coupling the information handling means and being operative as an input/output port; and clocking means for causing all th loops to move their contents in synchronism.

* * * * *